(12) United States Patent
Yang

(10) Patent No.: US 9,804,312 B2
(45) Date of Patent: Oct. 31, 2017

(54) WINDOW FOR DISPLAY DEVICE AND DISPLAY DEVICE INCLUDING THE SAME

(71) Applicant: SAMSUNG DISPLAY CO., LTD., Yongin, Gyeonggi-Do (KR)

(72) Inventor: Seongyul Yang, Cheonan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 68 days.

(21) Appl. No.: 14/806,697

(22) Filed: Jul. 23, 2015

(65) Prior Publication Data

US 2016/0190502 A1 Jun. 30, 2016

(30) Foreign Application Priority Data

Dec. 24, 2014 (KR) .................. 10-2014-0188440

(51) Int. Cl.
*H01L 29/08* (2006.01)
*G02B 5/30* (2006.01)
*H01L 51/52* (2006.01)

(52) U.S. Cl.
CPC .......... *G02B 5/3033* (2013.01); *H01L 51/524* (2013.01); *H01L 51/5246* (2013.01); *H01L 51/5281* (2013.01); *H01L 51/5284* (2013.01)

(58) Field of Classification Search
CPC ............................. H01L 51/52; G02B 5/3033

USPC ........................................................ 257/40
See application file for complete search history.

(56) References Cited

U.S. PATENT DOCUMENTS

| 2006/0262250 | A1 | 11/2006 | Hobbs | |
|---|---|---|---|---|
| 2012/0268914 | A1* | 10/2012 | Masumoto | G06F 3/044 362/19 |
| 2013/0314787 | A1 | 11/2013 | Jung et al. | |
| 2014/0226206 | A1 | 8/2014 | Park | |

FOREIGN PATENT DOCUMENTS

| JP | 2013-073175 A | 4/2013 | | |
|---|---|---|---|---|
| KR | 10-2008-0009280 A | 1/2008 | | |
| KR | 10-2011-0110593 A | 10/2011 | | |
| KR | 20120065687 A | * 6/2012 | ............ | G06F 3/044 |
| KR | 20120067031 A | * 6/2012 | ............ | G06F 3/044 |
| KR | 20120076026 A | * 7/2012 | | |
| KR | 10-2014-0101601 A | 8/2014 | | |

* cited by examiner

*Primary Examiner* — Ajay K Arora
(74) *Attorney, Agent, or Firm* — Lee & Morse, P.C.

(57) ABSTRACT

A window for a display device and a display device including the same are provided. The window for the display device includes: a window substrate having a first groove in a display area transmitting an image and a second groove in a non-display area adjacent to the display area; a polarizing film in the first groove; and a printed layer in the second groove.

17 Claims, 4 Drawing Sheets

WINDOW FOR DISPLAY DEVICE AND DISPLAY DEVICE INCLUDING THE SAME

CROSS-REFERENCE TO RELATED APPLICATION

Korean Patent Application No. 10-2014-0188440, filed on Dec. 24, 2014, in the Korean Intellectual Property Office, and entitled: "Window For Display Device and Display Device Including The Same," is incorporated by reference herein in its entirety.

BACKGROUND

1. Field

Embodiments relate to a window for a display device and a display device including the same, and more particularly, to a window for a slim display device and a display device including the same.

2. Description of the Related Art

Electronic devices, such as smartphones, digital cameras, laptop computers, navigation units, and televisions, include a display device for displaying an image. Such display devices include a display panel generating an image and displaying the image thereon and a window disposed on the display panel to protect the display panel.

Display panels use self-emissive display panels, e.g., organic light emitting diode (OLED) display panels, and non-emissive display panels, e.g., liquid crystal display (LCD) panels, electrophoretic display panels, electro-wetting display panels, and the like.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

According to an exemplary embodiment, a window for a display device, the window includes: a window substrate having a first groove in a display area transmitting an image and a second groove in a non-display area adjacent to the display area; a polarizing film in the first groove; and a printed layer in the second groove.

In the window according to the exemplary embodiment, the first and second grooves may be on different surfaces of the window substrate.

The first groove may be on an upper surface of the window substrate, and the second groove may be on a lower surface of the window substrate.

The first and second grooves may extend onto the non-display area and the display area, respectively, to overlap one another.

In a window according to another exemplary embodiment, the first and second grooves may be on a same surface of the window substrate.

The first and second grooves may be on a lower surface of the window substrate.

The polarizing film may be detachable from the first groove.

The printed layer may include a black matrix.

According to an exemplary embodiment, a display device includes: a display panel displaying an image; a window disposed upwardly of the display panel; and an adhesive layer disposed between the display panel and the window, wherein the window includes a window substrate having a first groove in a display area transmitting the image and a second groove in a non-display area adjacent to the display area, a polarizing film in the first groove, and a printed layer in the second groove.

In the display device according to the exemplary embodiment, the first and second grooves may be on different surfaces of the window substrate.

The first groove may be on an upper surface of the window substrate and the second groove may be on a lower surface of the window substrate.

The first and second grooves may extend onto the non-display area and the display area, respectively, to overlap one another.

In a display device according to another exemplary embodiment, the first and second grooves may be on a same surface of the window substrate.

The first and second grooves may be on a lower surface of the window substrate.

The polarizing film may be detachable from the first groove.

The printed layer may include a black matrix.

According to an exemplary embodiment, a window for a display device may include a window substrate having a first groove in a display area transmitting an image and a second groove in a non-display area adjacent to the display area, a polarizer in the first groove, and an opaque material layer in the second groove,

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
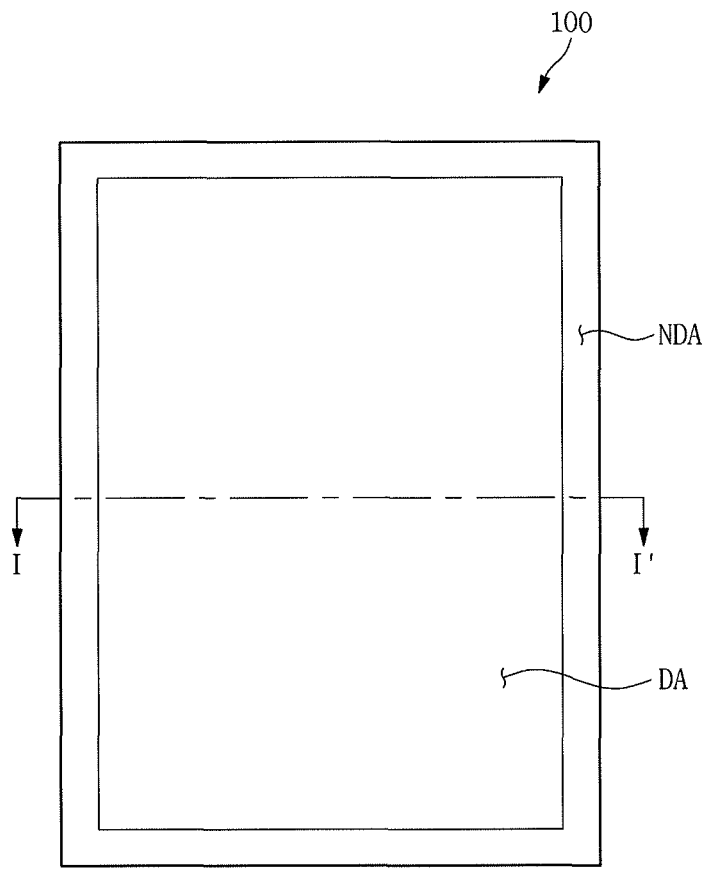
FIG. 1 illustrates a top plan view of a window for a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

All terminologies used herein are merely used to describe embodiments and may be modified according to the relevant art and the intention of an applicant. Therefore, the terms used herein should be interpreted as having a meaning that is consistent with their meanings in the context of the present disclosure, and is not intended to limit the embodiments. As used herein, the singular forms "a," "an," and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 2:
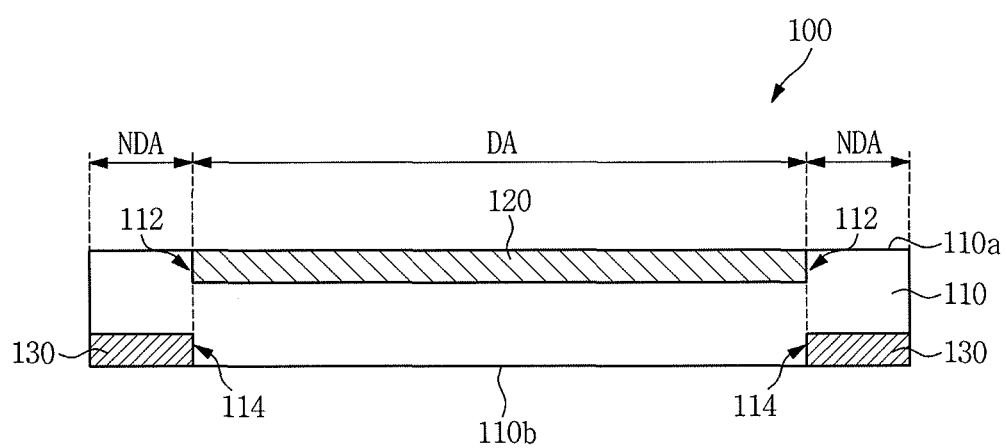
FIG. 2 illustrates a cross-sectional view taken along line I-I' of FIG. 1.

FIG. 1 illustrates a top plan view of a window for a display device according to an exemplary embodiment. FIG. 2 illustrates a cross-sectional view taken along line I-I' of FIG. 1.

Referring to FIGS. 1 and 2, a window 100 for a display device according to an exemplary embodiment (hereinafter, referred to as a "window") may include a window substrate 110, a polarizing film 120, and a printed layer 130.

The window substrate 110 may be a transparent glass substrate or a plastic substrate, and may have a quadrangular shape. However, the type of the window substrate 110 is not limited thereto, and the window substrate 110 may have various shapes; e.g., may include a curved corner portion and a bent corner portion therein.

The window substrate 110 may include a display area DA transmitting an image and a non-display area NDA adjacent to the display area DA and blocking the image. In addition, the window substrate 110 may include a first groove 112 in the display area DA and a second groove 114 in the non-display area NDA.

The first and second grooves 112 and 114 may be on different surfaces, i.e., opposite surfaces, of the window substrate 110. However, the disposition of the first and second grooves 112 and 114 is not limited thereto, e.g., the first and second grooves 112 and 114 may be disposed on the same surface, e.g., a lower surface, of the window substrate 110.

The first groove 112 may have a shape recessed, e.g., etched, in a direction from an upper surface 110a of the window substrate 110 to a lower surface 110b of the window substrate 110, and the second groove 114 may have a shape protruding, e.g., etched, in a direction from the lower surface 110b of the window substrate 110 to the upper surface 110a of the window substrate 110.

The first groove 112 may have the same size of area as that of the display area DA of the window substrate 110, and the second groove 114 may have the same size of area as that of the non-display area NDA of the window substrate 110. Accordingly, the first and second grooves 112 and 114 may not overlap one another at a boundary surface between the display area DA and the non-display area NDA of the window substrate 110.

The polarizing film 120 may be in the first groove 112. In particular, a thickness of the polarizing film 120 may be the same as a depth of the first groove 112. Thus, although the polarizing film 120 is on the window substrate 110, an overall thickness of the window 100 may not be increased.

The polarizing film 120 may be in the first groove 112 in a detachable manner, and thus, in a case in which scratch defects occur on a surface of the polarizing film 120, the polarizing film 120 may be replaced.

The polarizing film 120 may prevent reflection with respect to external light, and may prevent scattering when the window substrate 110 has been damaged.

The printed layer 130 may be in the second groove 113. In particular, a thickness of the printed layer 130 may be the same as a depth of the second groove 114. Thus, although the printed layer 130 is on the window substrate 110, the overall thickness of the window 100 may not be increased.

The printed layer 130 may have various colors, e.g., black or white. When the printed layer 130 is black, the printed layer 130 may include a black matrix. When the printed layer 130 is white, the printed layer 130 may include an organic insulating material, e.g., a white resin. In addition, the printed layer 130 may include an opaque inorganic material, e.g., chromium oxide (CrOx), molybdenum oxide (MoOx), or the like, or an opaque organic insulating material, e.g., a black resin.

The printed layer 130 may be a single layer; however, the number of layers to be included in the printed layer 130 is not limited thereto, and the printed layer 130 may include a plurality of layers.

Figure 3:
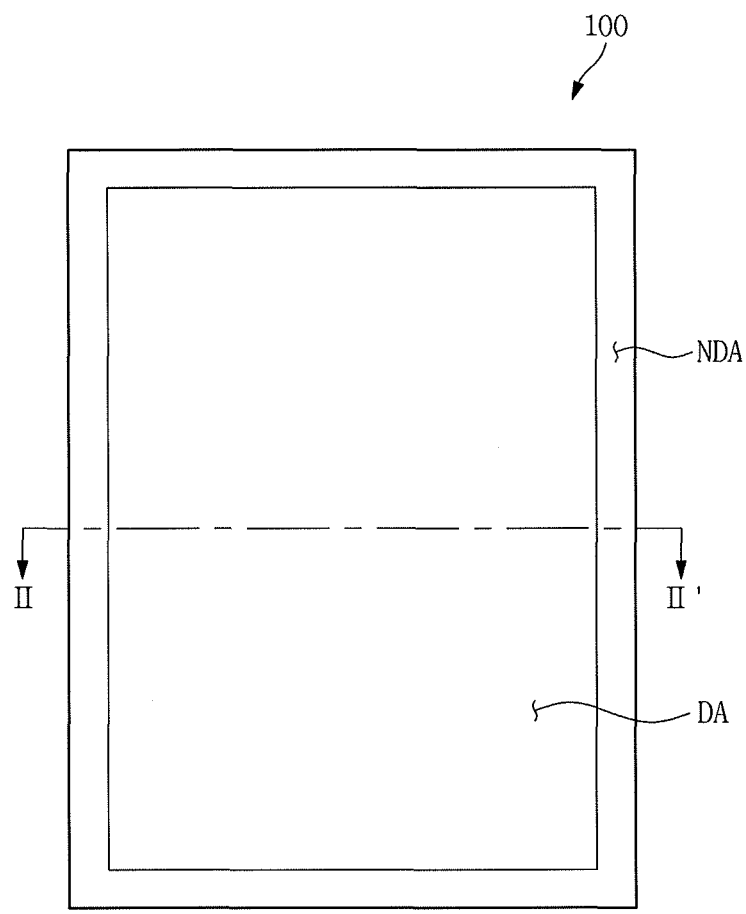
FIG. 3 illustrates a top plan view of a window for a display device according to another exemplary embodiment.
Figure 4:
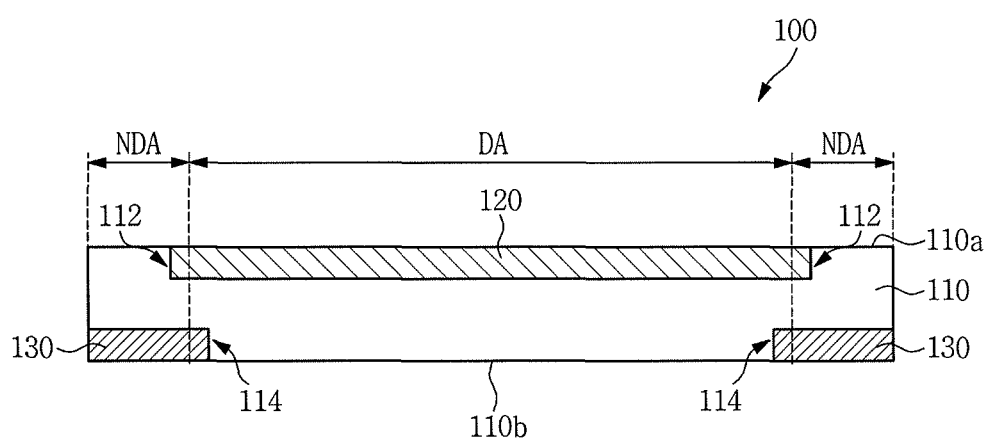
FIG. 4 illustrates a cross-sectional view taken along line II-II' of FIG. 3.

FIG. 3 illustrates a top plan view of a window for a display device according to another exemplary embodiment. FIG. 4 illustrates a cross-sectional view taken along line II-II' of FIG. 3.

Since the window of FIGS. 3 and 4 has the same configuration as that of FIGS. 1 and 2, aside from a disposition of first and second grooves 112 and 114, details pertaining thereto will not be repeated for conciseness.

Referring to FIGS. 3 and 4, the first groove 112 may have a shape recessed, e.g., etched in a direction from the upper surface 110a of the window substrate 110 to the lower surface 110b of the window substrate 110, and the second groove 114 may have a shape protruding, e.g., etched, in a direction from the lower surface 110b of the window substrate 110 to the upper surface 110a of the window substrate 110.

The first groove 112 may extend from a display area DA of the window substrate 110 to a non-display area NDA of the window substrate 110, and the second groove 114 may be extend from the non-display area NDA of the window substrate 110 to the display area DA of the window substrate 110. Accordingly, the first and second grooves 112 and 114 may overlap one another at a boundary between the display area DA and the non-display area NDA of the window substrate 110.

Accordingly, in the window according to the other exemplary embodiment, although the polarizing film 120 and the printed layer 130 are on opposite sides of the window substrate 110, an overall thickness of the window 100 may not be increased.

Figure 5:
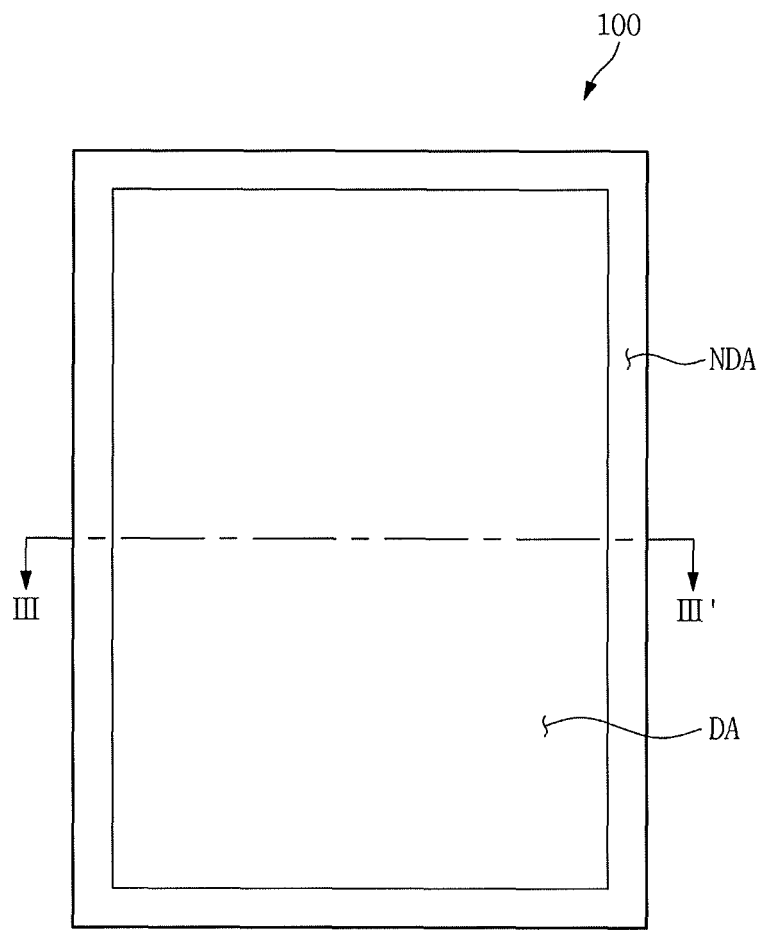
FIG. 5 illustrates a top plan view of a window for a display device according to still another exemplary embodiment.
Figure 6:
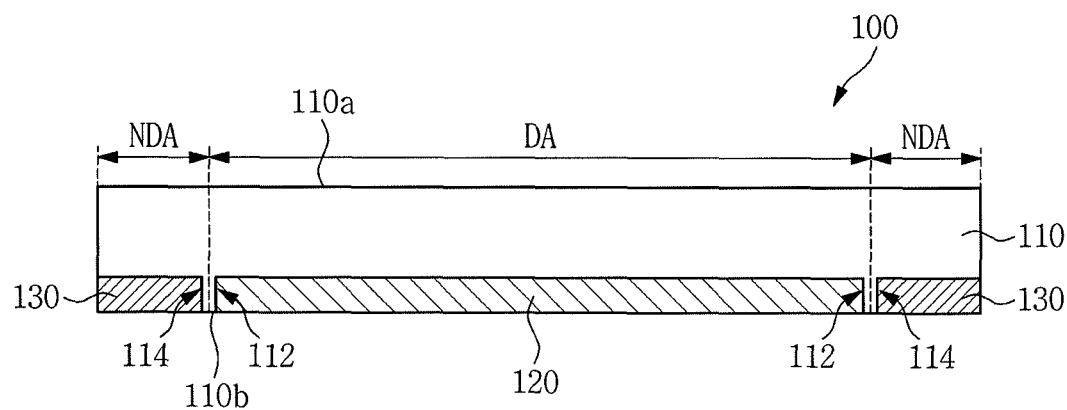
FIG. 6 illustrates a cross-sectional view taken along line III-III' of FIG. 5.

FIG. 5 illustrates a top plan view of a window for a display device according to still another exemplary embodiment. FIG. 6 is a cross-sectional view taken along line III-III' of FIG. 5.

Since the window of FIGS. 5 and 6 has the same configuration as that of FIGS. 1 and 2 aside from a disposition of first and second grooves 112 and 114, details pertaining thereto will be omitted for conciseness.

Referring to FIGS. 5 and 6, the first and second grooves 112 and 114 may be on the same surface of a window substrate 110, e.g., the lower surface 110b, and may have a shape protruding, e.g., etched, in a direction from the lower surface 110b of the window substrate 110 to the upper surface 110a of the window substrate 110.

The first and second grooves 112 and 114 may be in a display area DA and a non-display area NDA of the window substrate 110, respectively, and may be spaced apart from one another at a boundary between the display area DA and the non-display area NDA of the window substrate 110.

Accordingly, in the window according to the still other exemplary embodiment, although the polarizing film 120 and the printed layer 130 are on the window substrate 110, an overall thickness of the window 100 may not be increased.

Figure 7:
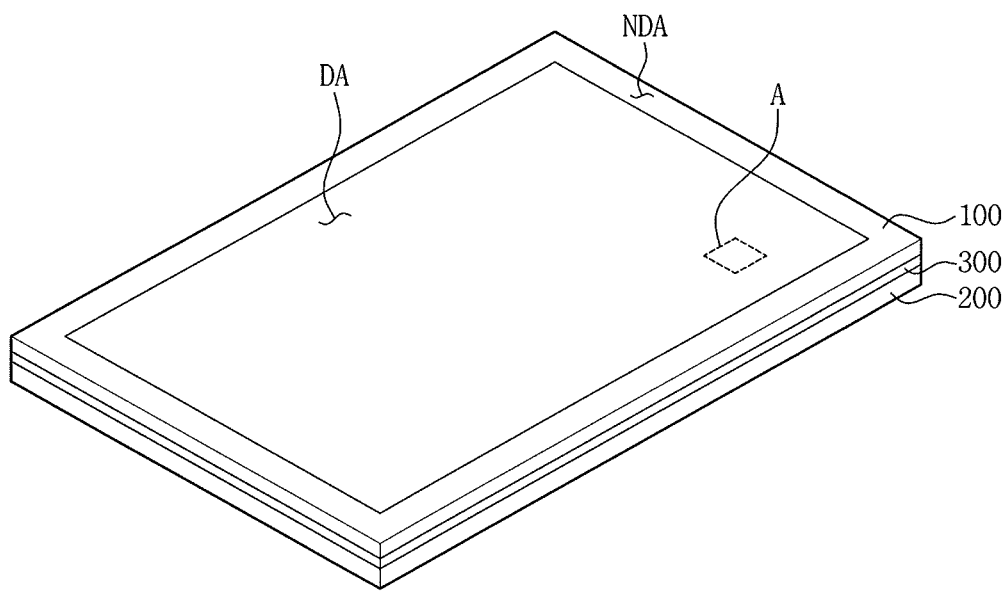
FIG. 7 illustrates a perspective view of a display device according an exemplary embodiment.

FIG. 7 illustrates a perspective view of a display device according an exemplary embodiment. Referring to FIG. 7, the display device according to the exemplary embodiment may include the window 100, a display panel 200, and an adhesive layer 300 between the window 100 and the display panel 200. Since the configuration of the window 100 in FIG. 7 is the same as that described hereinbefore with reference to FIGS. 1 through 6, details pertaining thereto will be not be repeated for conciseness.

The display panel 200 may generate an image, and the image generated in the display panel 200 may be transmitted through the window 100 to thereby be provided to a user.

The display panel 200 may be a self-emissive display panel, e.g., an organic light emitting diode (OLED) display panel, and a non-emissive display panel, e.g., a liquid crystal display (LCD) panel, an electrophoretic display panel, an electro-wetting display panel, and the like. Details pertaining to the display panel 200 will be described later with reference to FIG. 8.

The adhesive layer 300 may be between the window 100 and the display panel 200, and the window 100 and the display panel 200 may be bonded to one another by the adhesive layer 300.

The adhesive layer 300 may enhance luminance, transmissivity, reflectivity, and dependability of the display device, and may prevent an air gap from being formed between the window 100 and the display panel 200 and infiltration of foreign materials thereto, such as dust.

The adhesive layer 300 may be a photo-curable resin. When a photo-initiator included in a resin in a small quantity thereof receives light such as ultra violet (UV) light, a photo-polymerization reaction may be initiated, and a monomer and an oligomer, which are main components of the resin, may momentarily form a polymer to be cured.

Figure 8:
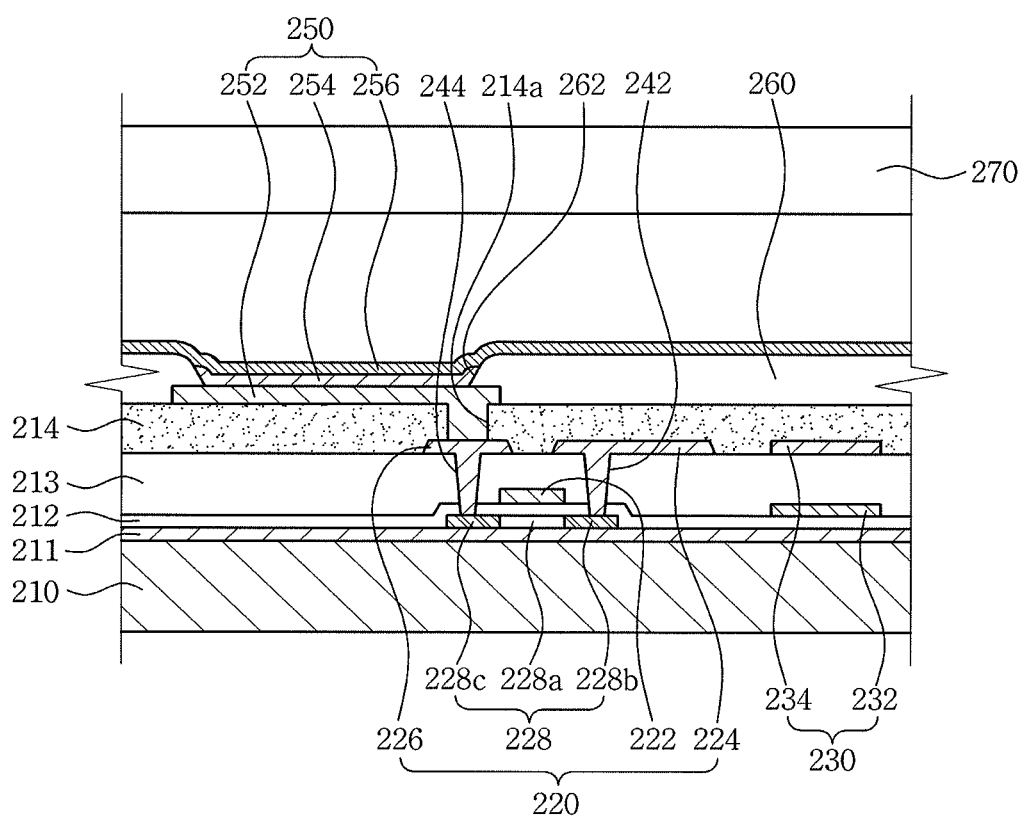
FIG. 8 illustrates a cross-sectional view of a structure of a pixel of a display panel disposed in portion "A" of FIG. 7.

FIG. 8 illustrates a cross-sectional view of a structure of a pixel of the display panel disposed in portion "A" of FIG. 7. In the display device according to the exemplary embodiment, it will be assumed that the display panel 200 is an OLED display panel.

Referring to FIG. 8, a first substrate 210 may use an insulating substrate formed of glass, quartz, ceramic, plastic, or the like. However, the material forming the first substrate 210 is not limited thereto. Accordingly, the first substrate 210 may also use a metallic substrate, e.g., stainless steel, or the like.

The first substrate 210 may include a buffer layer 211 thereon. The buffer layer 211 may serve to prevent infiltration of impure elements thereto and planarize a surface of the first substrate 210, and may be formed of various materials capable of performing the aforementioned functions. For example, the buffer layer 211 may include at least one of silicon nitride (SiNx), silicon oxide ($SiO_2$), and silicon oxynitride (SiOxNy). However, the buffer layer 211 is not necessarily required on the first substrate 210, and thus may be omitted based on the type, the process conditions, and the like, of the first substrate 210.

The buffer layer 211 may include a semiconductor layer 228 thereon. The semiconductor layer 228 may be one of a polycrystalline silicon layer, an amorphous silicon layer, an oxide semiconductor, e.g., indium-gallium-zinc oxide (IGZO), indium-zinc-tin oxide (IZTO), and the like, and so forth. For example, when the semiconductor layer 228 is a polycrystalline silicon layer, the semiconductor layer 228 may include a channel region 228a undoped with impurities, and source and drain regions 228b and 228c doped with p-type materials at both sides of the channel region 228a, respectively. In this instance, ion materials used for doping may be p-type impurities such as boron (B), and in particular, diborane ($B_2H_6$) may be used. Here, such impurities may differ based on the type of a thin film transistor (TFT).

The semiconductor layer 228 may have a gate insulating layer 212 thereon, the gate insulating layer 212 being formed of SiNx, $SiO_2$, or the like. The gate insulating layer 212 may include at least one of tetraethyl orthosilicate (TEOS), SiNx, and $SiO_2$. For example, the gate insulating layer 212 may have a double-layer structure in which a SiNx layer having a thickness of about 40 nanometers (nm) and a TEOS layer having a thickness of about 80 nm are sequentially stacked. However, the structure of the gate insulating layer 212 is not limited thereto, and may be provided in various manners.

The gate insulating layer 212 may include a gate wiring disposed thereon, the gate wiring including a gate electrode 222. The gate wiring may further include a gate line, a first sustaining electrode 232, and another wiring. The gate electrode 222 may be overlap at least a portion of the semiconductor layer 228, in particular, the channel region 228a. The gate electrode 222 may serve to block impurities from being doped in the channel region 228a at the time of the impurities being doped in the source and drain regions 228b and 228c of the semiconductor layer 228 during the formation of the semiconductor layer 228.

The gate electrode 222 and the first sustaining electrode 232 may be on the same layer, and may be formed of substantially the same metal material. The metal material may include at least one selected of molybdenum (Mo), chromium (Cr), tungsten (W), and the like. For example, the gate electrode 222 and the first sustaining electrode 232 may be formed of Mo or an alloy including Mo.

The gate insulating layer 212 may include an insulating interlayer 213 formed thereon to cover the gate electrode 222. The gate insulating layer 212 and the insulating interlayer 213 may have a source contact hole 242 through which the source region 228b is exposed and a drain contact hole 244 through which the drain region 228c is exposed. The insulating interlayer 213 may be formed of TEOS, SiNx, SiOx, or the like, in a manner similar to that of the gate insulating layer 212; however, the material forming the insulating interlayer 213 is not limited thereto.

The insulating interlayer 213 may include a data wiring (not illustrated) disposed thereon, the data wiring including a source electrode 224 and a drain electrode 226. The data wiring may further include a data line (not illustrated), a common power line (not illustrated), a second sustaining electrode 234, and another wiring. The source and drain electrodes 224 and 226 may be connected to the source and drain regions 228b and 228c of the semiconductor layer 228 through the source and drain contact holes 242 and 244, respectively.

As such, a TFT 220 including the gate electrode 222, the source electrode 224, the drain electrode 226, and the semiconductor layer 228 may be formed. Although a p-type metal-oxide semiconductor (PMOS) TFT using p-type impurities is used as the TFT 220 in the exemplary embodiment, the type of the TFT 220 is not limited thereto. Accordingly, the TFT 220 may also use an n-type metal-oxide semiconductor (NMOS) TFT or a complementary metal-oxide semiconductor (CMOS) TFT. In addition, the TFT 220 may also be formed using one of a polycrystalline TFT, an amorphous TFT including an amorphous silicon layer, and an oxide semiconductor TFT.

In addition, a power storage element 230 including the first sustaining electrode 232 and the second sustaining electrode 234 may be formed. Here, the insulating interlayer 213 may be a dielectric material of the power storage element 230.

The insulating interlayer 213 may include a planarization layer 214 formed thereon to cover the data wiring (not illustrated). The planarization layer 214 may serve to remove a step difference in and planarize the elements disposed on the insulating interlayer 213 in order to enhance light emission efficiency of an OLED element 250 which is to be formed on the planarization layer 214. In addition, the planarization layer 214 may have a pixel electrode contact hole 214a through which a portion of the drain electrode 226 is exposed.

The planarization layer 214 may be formed of at least one of a polyacrylate resin, an epoxy resin, a phenolic resin, a polyamide resin, a polyimide resin, an unsaturated polyester resin, a polyphenylenether resin, a polyphenylenesulfide resin, benzocyclobutene (BCB), and the liked.

The planarization layer 214 may include a pixel electrode 252 of the OLED element 250 formed thereon. As used herein, the pixel electrode 252 may refer to an anode electrode. The pixel electrode 252 may be connected to the drain electrode 226 through the pixel electrode contact hole 214a of the planarization layer 214.

In addition, the planarization layer 214 may include a pixel defining layer 260 formed thereon, the pixel defining layer 260 having an aperture 262 through which the pixel electrode 252 is exposed. That is, the pixel electrode 252 may be disposed to correspond to the aperture 262 of the pixel defining layer 260. The pixel defining layer 260 may be formed of a polyacrylate resin, a polyimide resin, or the like.

An organic light emitting layer 254 may be formed on the pixel electrode 252 within an area of the aperture 262 of the pixel defining layer 260, and a common electrode 256 may be formed on the pixel defining layer 260 and the organic light emitting layer 254.

As such, the OLED element 250 including the pixel electrode 252, the organic light emitting layer 254, and the common electrode 256 may be formed.

One of the pixel electrode 252 and the common electrode 256 may be formed using a transparent conductive material, and another thereof may be formed using one of a semi-transmissive material and a reflective conductive material. Based on the material forming the pixel electrode 252 and the common electrode 256, the type of the OLED display device may be determined to be a top-emission-type OLED, a bottom-emission-type OLED, or a double-sided-emission-type OLED.

The transparent conductive material may use at least one of indium-tin oxide (ITO), indium-zinc oxide (IZO), zinc oxide (ZnO), indium oxide ($In_2O_3$), and the like. The reflective conductive material may use at least one of lithium (Li), calcium (Ca), lithium fluoride/calcium (LiF/Ca), lithium fluoride/aluminum (LiF/Al), aluminum (Al), silver (Ag), magnesium (Mg), gold (Au), and the like.

The organic light emitting layer 254 may be formed of a low molecular weight organic material or a polymer organic material. The organic light emitting layer 254 may be formed as a multilayer including at least one of a hole injection layer (HIL), a hole transporting layer (HTL), a light emitting layer, an electron transporting layer (ETL), and an electron injection layer (EIL). For example, an HIL may be on the pixel electrode 252 having a positive pole, and may include an HTL, a light emitting layer, an ETL, and an EIL sequentially stacked thereon.

The OLED element 250 may include a second substrate 270 thereon. The second substrate 270 may be opposite the first substrate 210, and may cover the TFT 220 and the OLED element 250. The second substrate 270 may use a transparent insulating substrate formed of glass, quartz, ceramic, or the like, similarly to the first substrate 210. In addition, the second substrate 270 may be an encapsulating member, and may have a thin film structure in which an organic layer and an inorganic layer area alternately stacked.

As set forth above, according to exemplary embodiments, the window and the display device including the same may have a relatively reduced thickness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A window for a display device, the window comprising:
 a window substrate having a first groove in a display area transmitting an image and a second groove in a non-display area adjacent to the display area;
 a polarizing film in the first groove; and
 a printed layer in the second groove.

2. The window as claimed in claim 1, wherein the first and second grooves are on opposite surfaces of the window substrate.

3. The window as claimed in claim 2, wherein the first groove is on an upper surface of the window substrate, and the second groove is on a lower surface of the window substrate.

4. The window as claimed in claim 3, wherein the first and second grooves extend onto the non-display area and the display area, respectively, to overlap one another.

5. The window as claimed in claim 1, wherein the first and second grooves are on a same surface of the window substrate.

6. The window as claimed in claim 5, wherein the first and second grooves are on a lower surface of the window substrate.

7. The window as claimed in claim 1, wherein the polarizing film is detachable from the first groove.

8. The window as claimed in claim 1, wherein the printed layer includes a black matrix.

9. A display device comprising:
 a display panel displaying an image;
 a window on the display panel; and
 an adhesive layer between the display panel and the window,
 wherein the window includes a window substrate having a first groove in a display area transmitting the image and a second groove in a non-display area adjacent to the display area, a polarizing film in the first groove and a printed layer in the second groove.

10. The display device as claimed in claim 9, wherein the first and second grooves are on opposite surfaces of the window substrate.

11. The display device as claimed in claim 10, wherein the first groove is on an upper surface of the window substrate and the second groove is on a lower surface of the window substrate.

12. The display device as claimed in claim 11, wherein the first and second grooves extend onto the non-display area and the display area, respectively, to overlap one another.

13. The display device as claimed in claim 9, wherein the first and second grooves are on a same surface of the window substrate.

14. The display device as claimed in claim 13, wherein the first and second grooves are on a lower surface of the window substrate.

15. The display device as claimed in claim 9, wherein the polarizing film is detachable from the first groove.

16. The display device as claimed in claim 9, wherein the printed layer includes a black matrix.

17. A window for a display device, the window comprising:
 a window substrate having a first groove in a display area transmitting an image and a second groove in a non-display area adjacent to the display area;
 a polarizer in the first groove; and
 an opaque material layer in the second groove.

* * * * *